United States Patent [19]

Andersen et al.

[11] Patent Number: 4,562,548
[45] Date of Patent: Dec. 31, 1985

[54] ALARM LIMIT RECENTERING ARRANGEMENT FOR MAINTAINING UNIFORM ALARM LIMIT TOLERANCES ABOUT A SLOPING REGULATION CHARACTERISTIC

[75] Inventors: Brad E. Andersen, Dover; Billy H. Hamilton, Summit; Robert E. Schroeder, Flanders, all of N.J.

[73] Assignee: AT&T Bell Laboratories, Murray Hill, N.J.

[21] Appl. No.: 493,923

[22] Filed: May 12, 1983

[51] Int. Cl.⁴ .................... G01R 19/165; H02H 7/00
[52] U.S. Cl. .................................. 364/483; 324/416; 340/511; 361/18; 364/571
[58] Field of Search ............... 364/151, 480, 483, 571, 364/580; 340/511, 635, 657, 825.06; 324/115, 416; 361/18

[56] References Cited

U.S. PATENT DOCUMENTS

| 4,272,816 | 6/1981 | Matsumoto | 364/483 |
| 4,378,580 | 3/1983 | Stich | 361/18 X |
| 4,396,986 | 8/1983 | Salesky | 364/483 |
| 4,432,031 | 2/1984 | Premerlani | 364/483 X |

Primary Examiner—Errol A. Krass
Assistant Examiner—Kevin J. Teska
Attorney, Agent, or Firm—Alfred G. Steinmetz

[57] ABSTRACT

A microcomputer surveillance system is operative to monitor the output signal of a power supply to determine if an alarm limit has been reached and to center the alarm limits around an operating point of the power supply. Sensed output signals are converted to signal frequencies and transmitted optically to counters which accumulate counts indicative of the output signal. A microcomputer controller uses these counts to set alarm limits and determine if an alarm limit has been exceeded.

6 Claims, 11 Drawing Figures

FIG. 3

```
    main ()
10  {
11      for(;;)        /* infinite loop */
12      {
13          if( recentering desired )
14          {
15              if( present operating point )
16              {
17                  center ( mon_count );
18              }
19              else           /* arbitrary operating point */
20              }
21                  get value from keypad;
22                  convert to equivalent count;
23                  center( key_count );
24              }
25          }
26
27          if( want to update offset )
28          {
29              offset_calc();
30          }
31
32          alarm_check();         /* check output for alarms */
33      }
    }
```

FIG. 4

```
    center( count )
1   int count;
2   {
3                       /* compute upper limit for count */
4       high_count = ( count * high_factor ) + 0.5;
5
6                       /* computer lower limit for count */
7       low_count = ( count * low_factor ) + 0.5;
8
9   /* 0.5 added so integer is always rounded to
10   * the nearest value since the machine truncates
11   * the fractional part
12   */

```
 1  offset_calc()
 2  {
 3      /* prompt for accurate output reading */
 4      ref_value = output level;              /* reference value */
 5
 6      /* compute equivalent count for the reference_value */
 7      ref_count = ref_value * ref_scale;
 8
 9      /* new offset value */
10      offset = ref_count - mon_count;
11                      /* mon_count is count from counter */
    }
```

*FIG. 6*

```
 1  alarm_check()
 2  {
 3      start initialized counter for specified time ;
 4
 5      if( done )             /* get count */
 6          comp_count = mon_count + offset;       /* for display
 7                                                    of the output */
 8
 9      /* now check for alarm condition */
10      if( mon_count != last_count )    /* has count changed */
11      {
12          if( mon_count >= high_count )
13              alarm_high();
14
15          else if( mon_count <= low_count )
16              alarm_low();
17
18          else ;             /* count within limits */
19      }
    }
```

FIG. 7

```
1  /* center( count, p ) - routine to center the alarm limits around
2   *                      the value passed to it.
3   *
4   *                      modifies the alarm limit values contained in
5   *                      a table described by a structure 'alm_lim'.
6   */
7
8  extern struct alm_lim;
9
10 center( count, p )
11 unsigned int count;
12 struct alm_lim *p;
13 {
14              /* major high limit */
15     p->high2 = ( count * p->high2_factor ) + 0.5;
16
17              /* minor high limit */
18     p->high1 = ( count * p->high1_factor ) + 0.5;
19
20              /* minor low limit */
21     p->low1 = ( count * p->low1_factor ) + 0.5;
22
23              /* major low limit */
24     p->low2 = ( count * p->low2_factor ) + 0.5;
25
26              /* store new nominal count value */
27     p->nominal = count;
   }
```

FIG. 8

```
struct alm_lim {
1          unsigned int high2;
2          unsigned int high1;
3          unsigned int nominal;
4          unsigned int low1;
5          unsigned int low2;
6          float high2_factor;
7          float high1_factor;
8          float low1_factor;
9          float low2_factor;
           };
```

… 4,562,548

ALARM LIMIT RECENTERING ARRANGEMENT FOR MAINTAINING UNIFORM ALARM LIMIT TOLERANCES ABOUT A SLOPING REGULATION CHARACTERISTIC

TECHNICAL FIELD

This invention relates to power supply alarm systems and, more particularly, to a microcomputer controlled surveillance system for remote monitoring of voltage or current parameters.

BACKGROUND OF THE INVENTION

Large power supply systems offer protection arrangements to shutdown the system if regulated voltage and current conditions exceed predefined alarm limits. Frequently both high and low alarm limits are centered around a voltage or current regulation characteristic. Since regulation characteristics have a slope in the VI plane, alarm limits centered about one operating point are not still centered if the operating point of the power supply drifts or is changed to some other portion of the regulation characteristic curve. This places a restriction upon the tightness of the alarm tolerances permitted.

SUMMARY OF THE INVENTION

Therefore a microcomputer controlled surveillance system embodying the principles of the invention is operative to sense certain output signals and determine if predefined alarm limits have been reached. Since the operating point of the power supply is not at one single locus along the sloped regulation characteristic curve, the microcomputer controller includes instructions to recenter the alarm limits around the present operating point locus thereby permitting more precise and tighter tolerances in the alarm limits then would ordinarily be attained.

Communication from remote signal sensing units to the microcomputer is, via frequency modulated light signals, transmitted via optical transmission apparatus. Gated counters periodically sample the optical pulse signals and compare a count accumulated in a specified time interval to tabulated count values to determine if any of the alarm limits have been reached.

BRIEF DESCRIPTION OF THE DRAWING

An understanding of the invention may be readily attained by reference to the following specification and the accompanying drawing in which:

FIGS. 3 through 8 disclose in pseudocode format the instruction of the microcomputer controller operative to monitor and recenter alarm limits;

DETAILED DESCRIPTION

Figure 1:
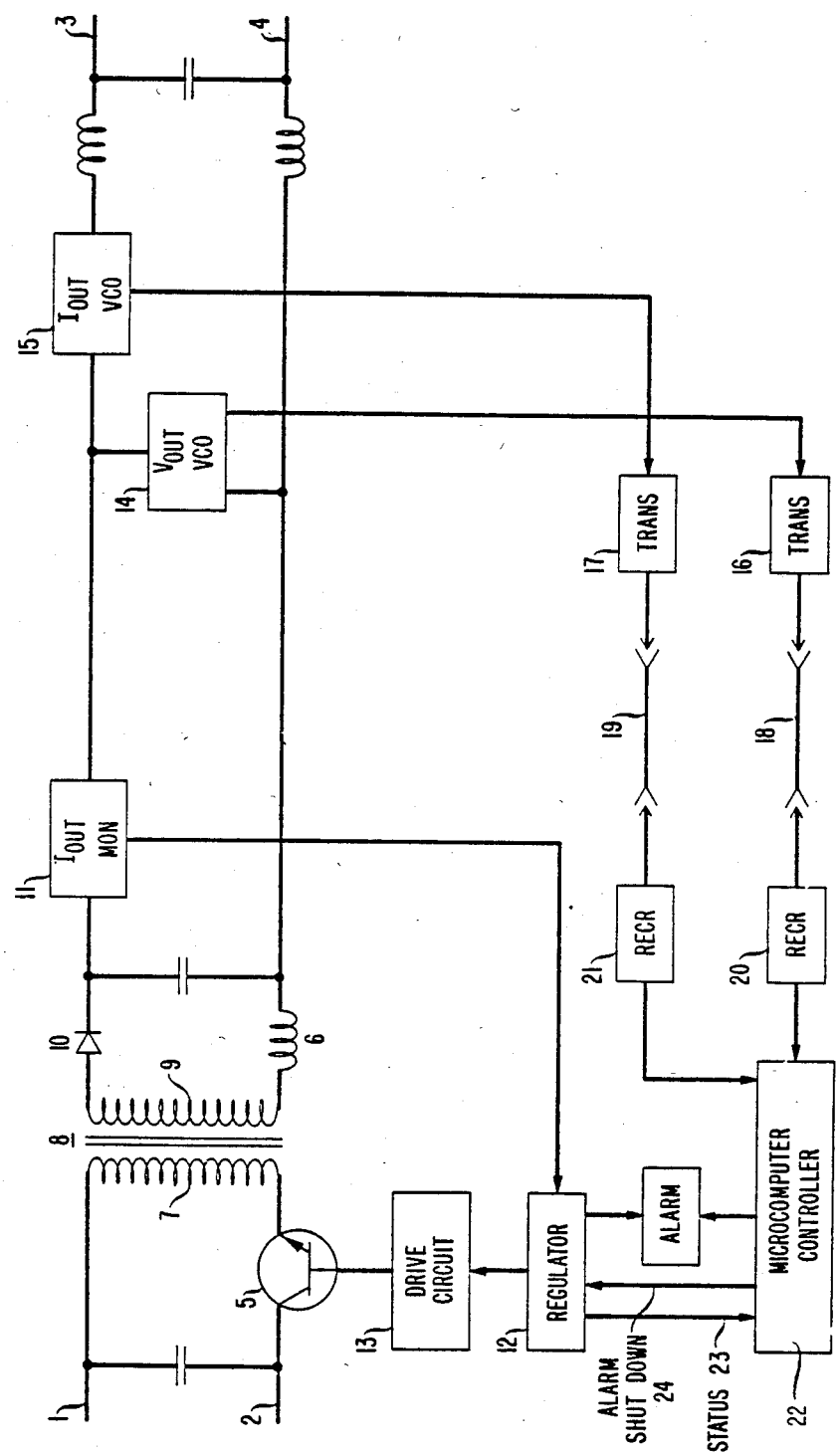
FIG. 1 is a schematic of a power supply including current and voltage shutdown and alarm monitoring circuits.

A switching type voltage regulator disclosed in FIG. 1 is operative to convert DC voltage at input terminals 1 and 2 to a regulated current at output terminals 3 and 4. The input terminals 1 and 2 are coupled by a transistor power switch 5 to the primary winding 7 of a power transformer 8. Secondary winding 9 is coupled through rectifying diode 10 and filter inductor 6 to the output terminals 3 and 4.

An output current monitor 11 senses the output current and applies it to a regulator circuit 12 which determines if it is at the desired value. Regulation circuit 12 supplies control signals to drive circuit 13 which, in turn, controls a conductive state of power switch 5. Regulator circuit 12 through drive circuit 13 controls a periodic conduction interval or duty cycle of power switch 5 in order to regulate the output current sensed by monitor 11.

Figure 10:
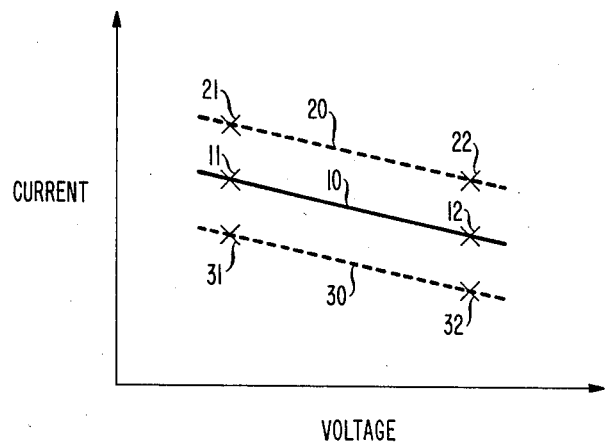
FIG. 10 is a graph of a typical current regulation characteristic and its associated alarm limits according to the principles of the invention.

A typical current regulation characteristic is shown in FIG. 10 where line 10 represents the current regulation characteristic locus. Points 11 and 12 represent different operating point loci at which the regulator may, at different times, be operating on. Lines 20 and 30 represent high and low alarm limit loci which according to the principles of the invention are maintained equidistant from the regulation characteristic. Points 21 and 22 and points 31 and 32 represent actual high and low alarm limits for the after centering about operating points 11 and 12.

An output voltage of the regulator is monitored by voltage monitor 14 and output current is further monitored by a current monitor 15. Both monitors 14 and 15 include voltage controlled oscillators (VCO) which are operative to convert the sensed signal amplitudes into a signal frequency. The outputs of the VCOs of monitors 14 and 15 are coupled, via optical transmitters 16 and 17 along optical transmission means 18 and 19 and optical receivers 20 and 21, to the microcomputer controller 22, respectively. Microcomputer controller 22 periodically counts the signal frequency for a fixed time interval to determine a count representative of the amplitude of the sensed signals. Regulator 12 is coupled to send status signals to the microcomputer controller 22 via lead 23 and receive control signals via lead 24. If a shutdown voltage or current magnitude is reached, microcomputer controller 22 supplies a signal to the regulator 12 to cause an immediate shutdown of the regulator circuit by having drive circuit 13 bias power switch 5 nonconducting in a cut off mode.

Figure 2:
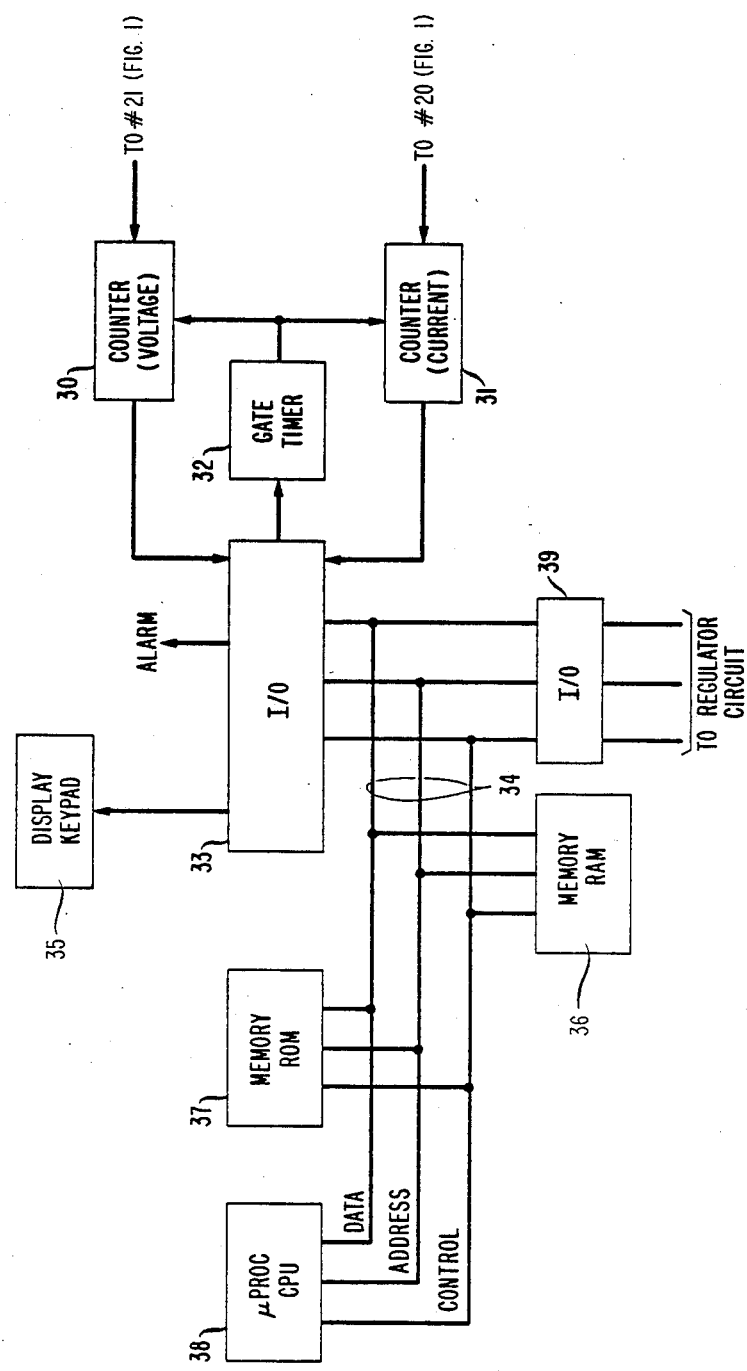
FIG. 2 is a block diagram of a microcomputer controller utilized to monitor and set the current and voltage alarm limit.

The microcomputer controller shown in FIG. 2 includes counter circuits 30 and 31 coupled to receive electrical signals from optical receivers 20 and 21 (shown in FIG. 1) which have signal frequencies representing the sensed output voltage and current, respectively. Counting of these electrical signals is performed for a specified time interval under control of the gate timer 32 which, in turn, is responsive to the input/output (I/O) circuit 33, which supplies the interface between the microcomputer bus 34 and external circuits such as counters 30 and 31. The I/O circuit 33 is connected to a display keyboard unit 35 which permits operatives to both input and display information. It may be used to enter information into the computer RAM memory 36. The instruction controlling the recentering operation and other processes is contained in the ROM memory circuit 37. The instructions contained therein are executed by the microprocessor or central processing unit 38. I/O circuit 39 also connected to the bus 34 is utilized to interface with the regulator circuit 12 in FIG. 1.

Operation of the microcomputer is under the control of instructions stored in the memory (ROM) circuit 37. These instructions include, in addition to general control instructions, specific instructions to perform the recentering operation to recenter alarm limits around the present operating point locus. Pseudocode representing these instructions is shown in FIGS. 3 through 8.

The following definitions will assist in understanding the route disclosed in pseudocode.

DEFINITIONS mon_count—count obtained from the actual counter comp_count—mon_count plus the offset, this value can be used for output display key_count—equivalent 'mon_count' for the value entered by a keypad high_factor—value to compute alarm high limit [(>1.0), e.g., 1.05]

low_factor—value to compute alarm low limit [(<1.0), e.g., 0.95]

ref_value—voltage or current value obtained from meter and entered by keypad entry ref_scale—factor to convert ref_value to equivalent count (ref_count)

last_count—previous mon_count

The 'main' routine is disclosed in FIG. 3 and is operative for calling the 'center' subroutine of FIG. 4, the 'offset calc' subroutine of FIG. 5 and the 'alarm check' subroutine of FIG. 6. The pseudocode representation of FIGS. 3 through 6 is shown in C language format. An exposition of C language may be found in the article "The C Programming Language" by D. M. Ritchie et al, published in the Bell System Technical Journal, July-August 1978, pages 1991-2020. The 'main' routine disclosed in pseudocode in FIG. 3 is run continuously by the microcomputer or as specified by the comment accompanying the 'for' command of line 11. It runs as an infinite loop since the 'for' command has no argument specified. Pseudocode is comprised of informal ordinary language like statements that are not limited to a particular programming language and which are descriptive of the program logic. Pseudocode is well-known to those skilled in the art and it is not believed necessary to discuss it in detail.

The 'if' command of line 13 inquires if a recentering of the alarm count limits about the operating point count is needed. This need may be expressed by input by an operator at the input keyboard. If recentering is indicated, the routine 'center (mon_count)' is called and the present count value or argument representing a voltage or current (mon_count) is passed to the called subroutine 'center' shown in FIG. 4. The 'center' subroutine takes the count from the 'main' routing of FIG. 3 and in line 4 computes high_count by multiplying the count by high_factor to determine an upper limit count representative of an upper limit alarm level. A value 0.5 is added to the count in the computation process as a factor to compensate for truncation error. Similarly in line 7, a low limit count is computed which is representative of a low limit alarm. The values for high and low factors are selected from a table of alarm limit values stored in memory as shown in FIG. 8. These will be described subsequently with a description of the coding in C language of the 'center' routine shown in FIG. 7.

If the regulator is in a start up mode, there may be no present steady state operating point about which to center the alarm limit. In accordance with the 'else' statement of line 19, the value for centering the alarm limit is obtained directly from the keyboard generally after the display has given the operator a prompt signal. The value entered by the operator is then converted to an equivalent count value. The 'center' routine is called which uses the converted input count from the keyboard (key_count) as its argument instead of the actual operating point.

Figure 11:
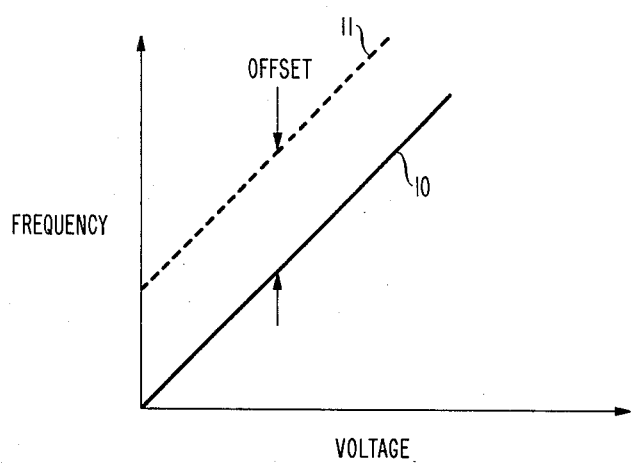
FIG. 11 is a graph of a VCO frequency-to-voltage characteristic both actual and idealized.

The subsequent 'if' command of line 27 is operative to update an offset value which is utilized to bring values illustrated on the display terminal into accord with values that could be measured by a craftsman with an electrical meter at the output of the power supply. If the offset value is to be updated the 'offset_calc' routine of FIG. 5 is called. The 'offset_calc' routine takes the keyed-in value and computes an equivalent count for this reference value in lines 3 and 6. The new updated offset value is computed in line 9 by summing the reference count with the monitor count. The offset count reflects the displacement of the frequency-to-voltage transfer curve of the VCOs from a curve which represents the design objective. This is readily apparent from FIG. 11 where line 10 represents the ideal voltage-to-frequency transfer and line 11 represents the actual transfer curve. The offset count compensates for this displacement so that displayed values reflect actual values.

The 'alarm check' called in line 32 in FIG. 3 is operative to determine if an alarm limit has been reached by the present level of output voltage or current. Line 2 of the 'alarm check' routine in FIG. 6 starts the counting activity in the converter and continues counting for a specified time. The 'if' command of lines 5 and 6 calculate a value for display purposes for the count value in the counter and the previously calculated offset value when the count has been performed. The 'if' command of line 10 checks for alarms if the new count is different from the previous count. The subsequent 'if' commands of line 12 and line 15 determine if the count value attained in the specified time indicates that a high or low alarm limit, respectively, has been reached. If not, the 'else' of line 18 specifies that no alarm be given.

The C language program of the 'recentering' routine shown in FIG. 7 is interactive with the stored data as shown in FIG. 8 to determine a new operating point about which the alarm limits are centered. The routine operates in conjunction with values in the alarm limit table of FIG. 8 and replaces certain of these values on lines 1 through 5 with new updated values.

As shown in the illustrative table, there are two high limits 1 and 2 and two low limits 1 and 2 which represent major and minor alarm limits. The minor alarm limit might represent a warning level and the major alarm limit would call for a shutdown of the regulator.

The routine begins by pointing to the major high limit of line 1 in the table of FIG. 8 which is accessed by the pointer of subroutine 'center' (line 12 to 15, FIG. 7) and a new value for unsigned int high 2 is calculated and put into line 1 of the table of FIG. 8 in place of the previous value. The commands of line 15, 18, 21 and 24 writes over old values and establishes new alarm limit values for lines 1, 2, 4 and 5 of the table of FIG. 8. The table values of lines 6 through 9 of FIG. 8 are permanent and are used as fixed factors for calculating the values of lines 1 through 5. The final result of the operation of the 'center' subroutine is the establishment of a new value for the count value about which the alarm limits are centered in line 27.

Figure 9:
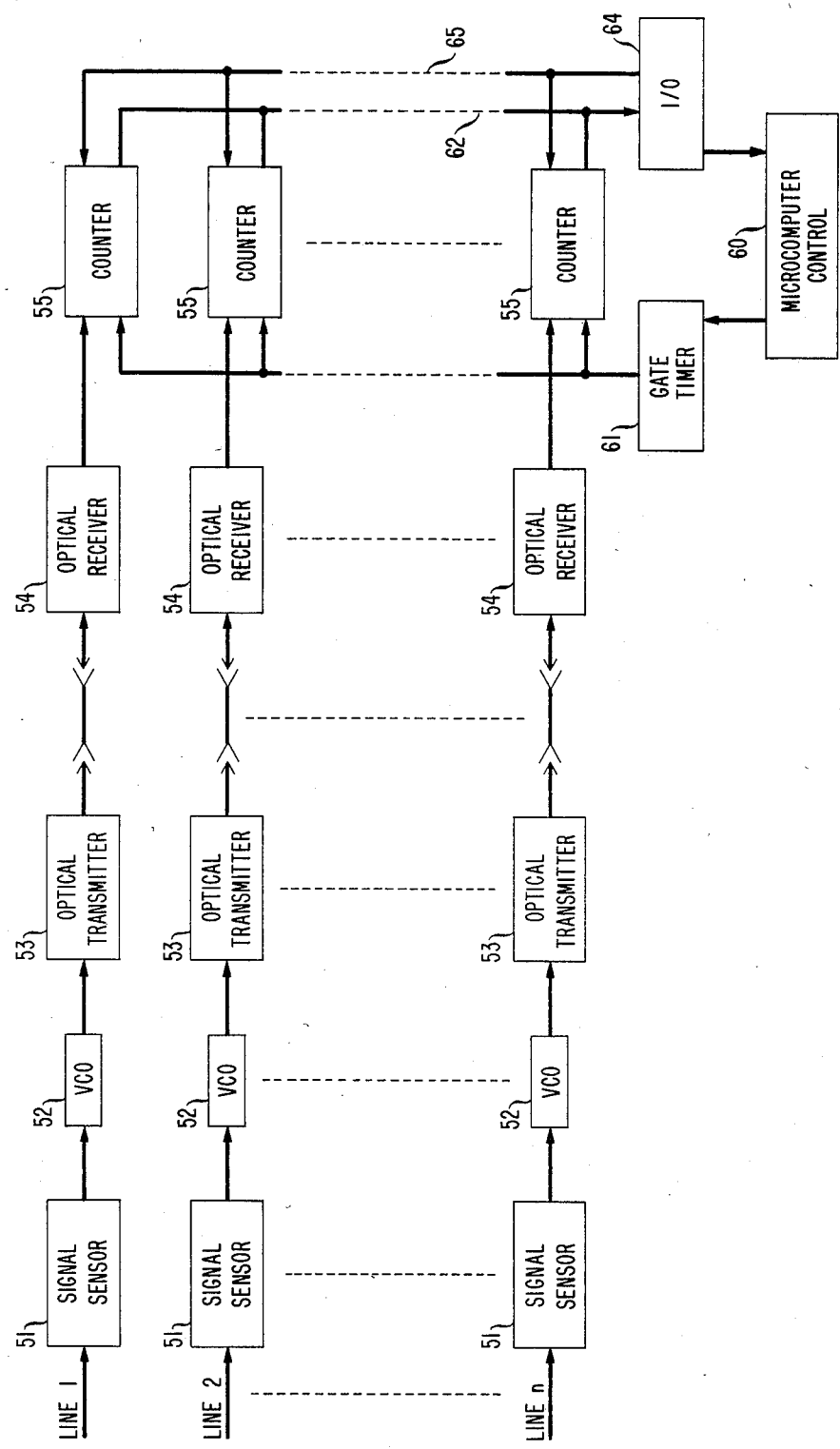
FIG. 9 is a schematic of an arrangement to measure alarm limits of a plurality of power supplies.

While the microcomputer control has been illustrated above for a single voltage regulator, a single microcomputer control may be used for a plurality of regulators by utilizing the ability of the microcomputer to poll a great number of inputs. Such an arrangement is disclosed in FIG. 9 wherein a plurality of signal sensors 51 are coupled to lines 1 through n. In each individual case, the sensed signals are converted to signal frequencies by a voltage controlled oscillator 52 and converted to light frequency signals by optical transmitters 53. The light signals are reconverted to electrical signals by the optical receivers 54 whose pulse frequency output is coupled to counters 55.

The microcomputer controller 60 controls a gate timer circuit 61 to enable counting in the counters 55 for a specified time interval. The count accumulated in each counter 55 during the time interval is coupled via bus 62 to the input/output port 64 of the microcomputer controller in response to control signals on bus 65. These counts are then individually evaluated by the microcomputer controller 60 in the same manner as disclosed hereinabove.

What is claimed is:

1. An alarm condition detection system controlled by a stored program control comprising:
   means for monitoring an electrical signal amplitude to determine if an alarm limit has been reached,
   information storage means including a table of alarm limits and stored program instructions for detecting an alarm limit,
   means, responsive to the means for monitoring, for converting the electrical signal amplitude to a digital count value and transmitting the digital count value to the information storage means,
   the stored program instructions including specific instructions for referencing values in the table of alarm limits to a present regulated operating point, the specific instructions including
   a first instruction for recording a present operating point signal level and further calling a second instruction for computing new alarm limits and a third instruction for substituting the new alarm limits for present alarm limits in the table of alarm limits.

2. An alarm condition detection system as defined in claim 1 wherein the means for converting an electrical signal amplitude to a digital count value includes means for converting a signal amplitude to a signal frequency, means for optically transmitting the signal frequency and receiving means for changing the signal frequency into a count value indicative of the signal amplitude.

3. An alarm condition detection system as defined in claim 2 wherein the stored program instructions include a fourth instruction for applying an offset value to a signal level encoded as a count value so its value for display purposes corresponds to an actual signal amplitude.

4. An alarm condition detection system as defined in claim 3 wherein the electrical signal amplitude encoded as a digital count value is compared with new alarm limits, and means for indicating an alarm condition when the new alarm limits are exceeded.

5. An alarm condition detection system controlled by a stored program control comprising:
   means for monitoring an output signal amplitude including:
   means for converting a signal amplitude to a signal frequency,
   means for converting the signal frequency into a count value representative of the signal amplitude,
   a microprocessor system for data processing and evaluation of count values from said means for monitoring including information storage means including a stored program and a table of alarm limits and instructions for controlling processing of the count values and establishment of related alarm limits;
   the stored program including:
   an instruction routine for referencing values in the table of alarm limits to a present regulating operating point of the power system comprising:
   a first instruction for recording a present operating point signal level,
   a second instruction for computing new alarm limits,
   a third instruction for implementing new alarm limits in place of any previous alarm limits for another operating point signal level, and
   a fourth instruction for comparing an existing output signal amplitude with the new alarm limits and indicating an alarm condition if limits are exceeded.

6. An alarm condition detection system as defined in claim 5 whereby the instruction routine further includes a fifth instruction for applying an offset factor to a present regulating operating point in order to convert it to a conventional value such as obtained from a conventional signal meter.

* * * * *